United States Patent
Sechrist et al.

(10) Patent No.: US 9,089,068 B2
(45) Date of Patent: Jul. 21, 2015

(54) CABLE BACKPLANE SYSTEM

(71) Applicant: Tyco Electronics Corporation, Berwyn, PA (US)

(72) Inventors: Joshua Tyler Sechrist, Etters, PA (US); Christopher David Ritter, Hummelstown, PA (US); Nathan Glenn Lehman, Harrisburg, PA (US); Brian Patrick Costello, Scotts Valley, CA (US); Robert Paul Nichols, Vacaville, CA (US)

(73) Assignee: Tyco Electronics Corporation, Berwyn, PA (US)

( * ) Notice: Subject to any disclaimer, the term of this patent is extended or adjusted under 35 U.S.C. 154(b) by 119 days.

(21) Appl. No.: 13/911,262

(22) Filed: Jun. 6, 2013

(65) Prior Publication Data

US 2014/0360752 A1    Dec. 11, 2014

(51) Int. Cl.
*H02G 3/10* (2006.01)
*H05K 7/14* (2006.01)
*H02B 1/20* (2006.01)

(52) U.S. Cl.
CPC ............ *H05K 7/1491* (2013.01); *H05K 7/1447* (2013.01); *H02B 1/202* (2013.01)

(58) Field of Classification Search
CPC ...... H05K 7/1491; H05K 7/1447; H02B 1/202
USPC ........................ 174/50; 211/26, 182; 361/829; 312/223.1
See application file for complete search history.

(56) References Cited

U.S. PATENT DOCUMENTS

| | | | | |
|---|---|---|---|---|
| 8,237,052 B2 * | 8/2012 | Adducci et al. | ................. | 174/50 |
| 8,395,046 B2 * | 3/2013 | Nicewicz et al. | ................ | 174/50 |
| 8,655,137 B2 * | 2/2014 | Baldassano et al. | ........... | 385/135 |

* cited by examiner

*Primary Examiner* — Dhirubhai R Patel

(57) ABSTRACT

A cable backplane system includes a backplane having a plurality of openings therethrough and a cable rack coupled to a rear of the backplane. The cable rack includes a tray having a frame surrounding a raceway and a brick held by the tray. The brick has side spacers at opposite sides of the brick and plates coupled to the side spacers that support a plurality of cable connector assemblies. Each cable connector assembly is positioned between and supported by corresponding plates on opposite sides of the cable connectors with the cable connectors positioned in corresponding openings in the backplane. The plates each include a hem folded over at a rear of the plate. The hem has an edge positioned rearward of the cable connectors and supporting the cable connectors from retreating from the openings in the backplane.

20 Claims, 12 Drawing Sheets

CABLE BACKPLANE SYSTEM

BACKGROUND OF THE INVENTION

The subject matter herein relates generally to a cable backplane system.

Communication systems, such as network systems, servers, data centers, and the like, use large printed circuit boards, known as backplanes, to interconnect midplanes, daughtercards, line cards and/or switch cards. The communication systems use high speed differential connectors mounted to the backplane and high speed differential connectors mounted to the line cards and switch cards to transmit signals therebetween. The backplane interconnects the various connectors using traces along the circuit board.

As the density of the systems increase and requirements for high speed lines increase, the printed circuit boards continue to become larger and the signal integrity inherently degrades as the signals travel further along the entire channel. At least some systems have replaced the traditional backplanes with cable assemblies. However, packaging of large numbers of cable assemblies is difficult. Cable management is a limiting factor in such systems. Additionally, assembly of such systems with the large number of cables is problematic. Holding the cable connectors in proper position for mating with the line and switch cards is difficult.

A need remains for a cable backplane system that may be assembled in a cost effective and reliable manner.

BRIEF DESCRIPTION OF THE INVENTION

In one embodiment, a cable backplane system is provided including a backplane having a plurality of openings therethrough and a cable rack coupled to a rear of the backplane. The cable rack includes a tray having a frame surrounding a raceway and a brick held by the tray. The brick has side spacers at opposite sides of the brick. The brick has plates coupled to the side spacers that support a plurality of cable connector assemblies. Each cable connector assembly has a plurality of cables extending between at least two cable connectors. The cables are routed in the raceway. Each cable connector assembly is positioned between and supported by corresponding plates on opposite sides of the cable connectors with the cable connectors positioned in corresponding openings in the backplane. The plates each include a hem folded over at a rear of the plate. The hem has an edge positioned rearward of the cable connectors and supporting the cable connectors from retreating from the openings in the backplane.

Optionally, the hem may extend along an interior surface of the plate at a rear of the plate. The hem may be fixed to the plate. The hem may double a thickness of the plate to stiffen the plate. Optionally, the plate may be folded over at a rear of the plate to form the hem. The plate may have a curved edge at the rear.

Optionally, the edge of the hem may be forward facing. The edge may block the cable connectors from moving in a rearward direction. Optionally, the cable connectors may each include a housing and a plurality of contact modules received in the housing. The cables may extend reward from the contact modules. The edge of the hem may block removal of the contact modules from the housing.

Optionally, the plates may include slots therein. The cable connectors may have lugs received in the slots to hold the cable connectors in the plates. The slots may be oversized relative to the lugs to allow the cable connectors to float relative to the plates. The cable connectors may float in at least two directions relative to the plates. The spacers may be coupled to the plates using float mechanisms that allow limited movement of the plates relative to the spacers.

In another embodiment, a cable rack for a cable backplane system is provided that includes a tray having a frame with side walls surrounding a raceway. A brick is held by the tray. The brick has side spacers at opposite sides of the brick. The brick has plates coupled to the side spacers. Each plate has slots formed therein proximate to a front of the plate. The plates support a plurality of cable connector assemblies. Each cable connector assembly has a plurality of cables extending between at least two cable connectors. The cables are routed in the raceway. Each cable connector has lugs extending therefrom that are received in corresponding slots in the plates. The slots are oversized relative to the lugs to allow the cable connectors to float relative to the plates. Optionally, the plates each include a hem folded over at a rear of the plate, the hem having an edge positioned rearward of the cable connectors and blocking the cable connectors from moving rearward relative to the plates.

DETAILED DESCRIPTION OF THE INVENTION

Figure 1:
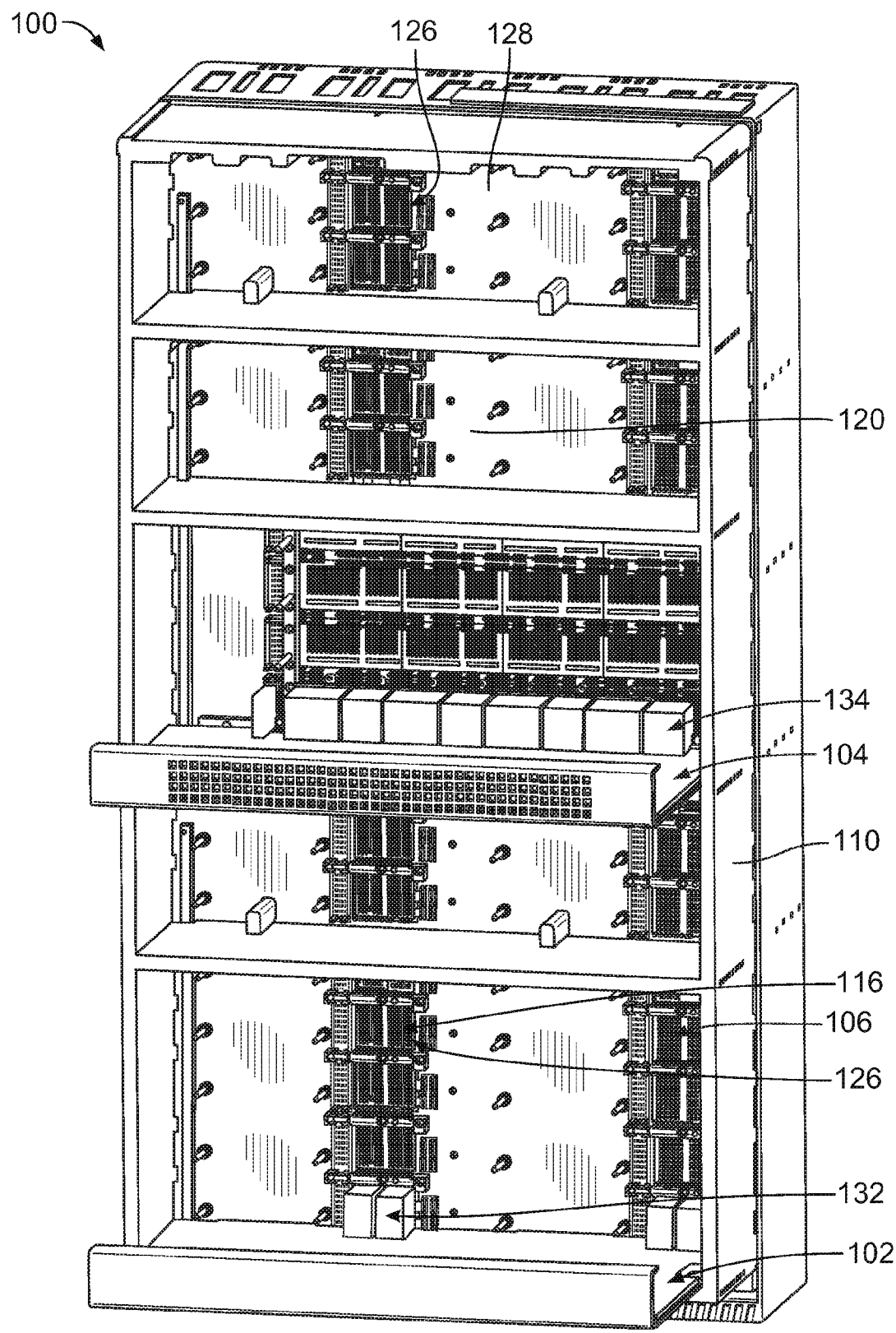
FIG. 1 is a front perspective view of a cable backplane system formed in accordance with an exemplary embodiment.
Figure 2:
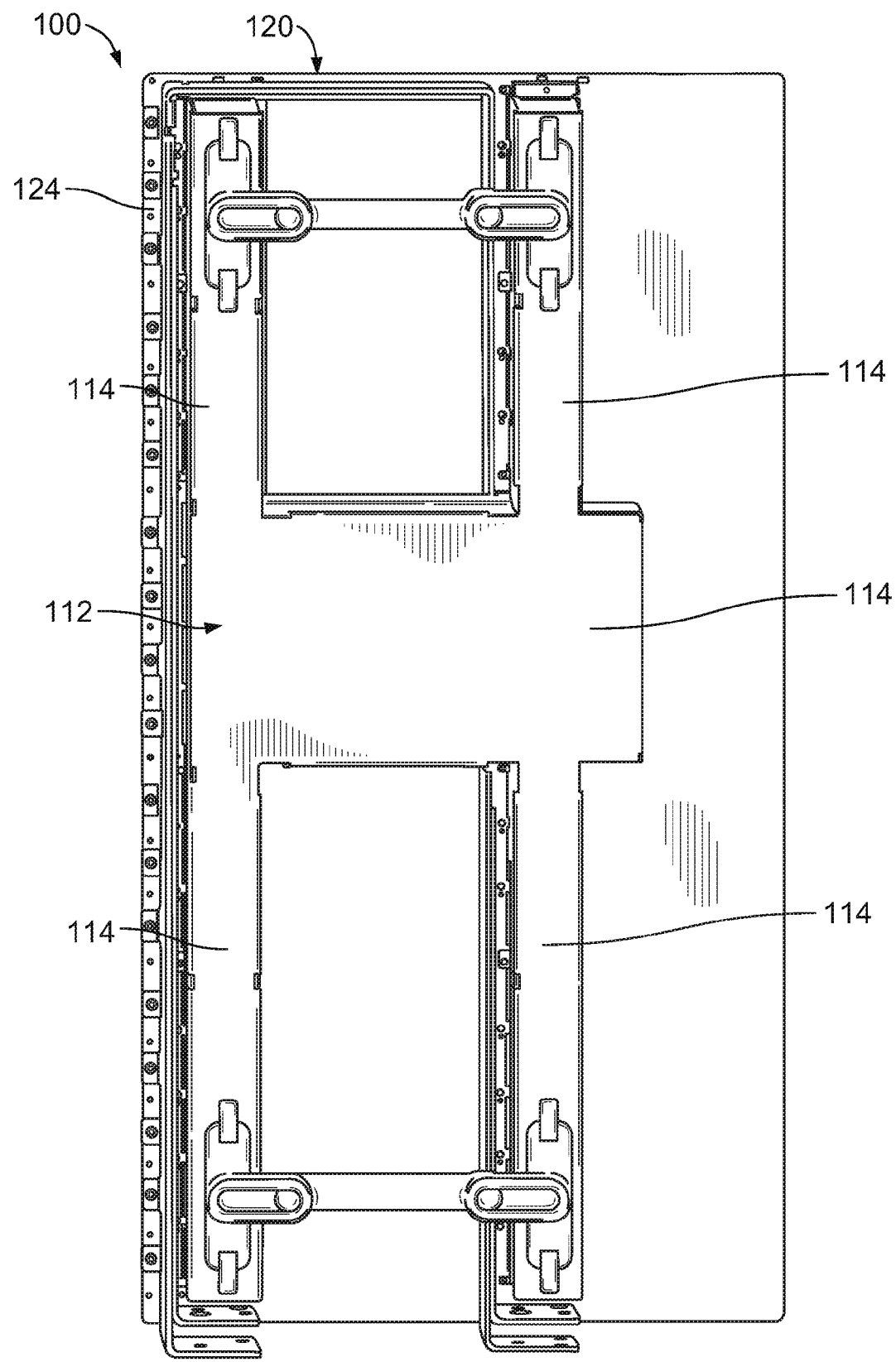
FIG. 2 is a rear perspective view of the cable backplane system.

FIG. 1 is a front perspective view of a cable backplane system 100 formed in accordance with an exemplary embodiment. FIG. 2 is a rear perspective view of the cable backplane system 100. The cable backplane system 100 is used in a data communication application, such as a network switch. The cable backplane system 100 interconnects line cards 102 and switch cards 104 using cable connector assemblies 106. The cable backplane system 100 may be used to interconnect with other types of connectors and/or cards, such as daughtercards, in other embodiments.

The cable connector assemblies 106 include cable connectors 116 that are interconnected by cables within the cable backplane system 100. The cable connector assemblies 106 eliminate interconnections via traces of a circuit board, such as a backplane circuit board. The cable connector assemblies 106 have improved signal performance along the signal paths between various connectors of the cable backplane system 100 as compared to conventional backplanes. The cable connector assemblies 106 support higher speeds, longer signal path lengths and lower cost per channel as compared to conventional backplanes. The cable connector assemblies 106 provide shielding of signal lines for improved signal performance. The cable connector assemblies 106 are packaged in a structure that allows accurate cable and connector location for mating with the corresponding line cards 102 and switch cards 104.

The cable backplane system 100 includes a chassis 110 that supports the components of the cable backplane system 100. The chassis 110 may include a rack, a cabinet or other suitable structures for holding the components of the cable backplane system 100. The chassis 110 may include structures for guiding, supporting and/or securing the lines cards 102 and switch cards 104 coupled to the cable backplane system 100.

The cable backplane system 100 includes a cable rack 112 that supports and/or manages the cables of the cable connector assemblies 106. The cable rack 112 includes a plurality of trays 114 that are held together and extend along different portions of the cable backplane system 100. The trays 114 may be box-shaped and define raceways for the cables. The cable rack 112 supports a plurality of the cable connectors 116 which form parts of the cable connector assemblies 106.

The cable backplane system 100 includes a backplane 120. The backplane 120 may be a circuit board and may be manufactured from typical circuit board material, such as FR-4 material. Electrical components, such as power supplies, fans, connectors, and the like may be attached to the backplane 120. Such electrical components may be electrically connected to traces of the backplane 120.

The backplane 120 and cable rack 112, with the cable connector assemblies 106, are coupled together to form the cable backplane system 100. The cable rack 112 is provided along a rear 124 of the backplane 120. The cable connectors 116 extend through openings 126 in the backplane 120 and are presented at a front 128 of the backplane 120 for mating with the line and switch cards 102, 104. The cable connectors 116 are not electrically connected to the backplane 120, as is typical of conventional backplanes, but rather the cable connectors 116 are interconnected by cables extending between the cable connectors 116.

In an exemplary embodiment, the cable rack 112 is flexible to allow the cable connectors 116 to align with and pass through the openings 126. Optionally, portions of the trays 114 may pass through the openings 126 with the cable connectors 116. The trays 114 may float relative to each other to properly align the cable connectors 116 with the corresponding openings 126. The backplane 120 holds the cable connectors 116 in precise locations for mating with the line and switch cards 102, 104. The backplane 120 has tight tolerances to control mating with the line and switch cards 102, 104. The cable rack 112 is flexible to allow the trays 114 to be properly aligned relative to the backplane 120. In an exemplary embodiment, the cable connectors 116 float relative to one another and relative to the trays 114 to allow precise positioning of the cable connectors 116 relative to the backplane 120 for mating with the line and switch cards 102, 104. The line and switch cards 102, 104 have card connectors 132, 134, respectively, that mate with corresponding cable connectors 116. The cable connectors 116 need to be precisely positioned relative to the backplane 120 for mating with corresponding card connectors 132, 134.

Figure 3:
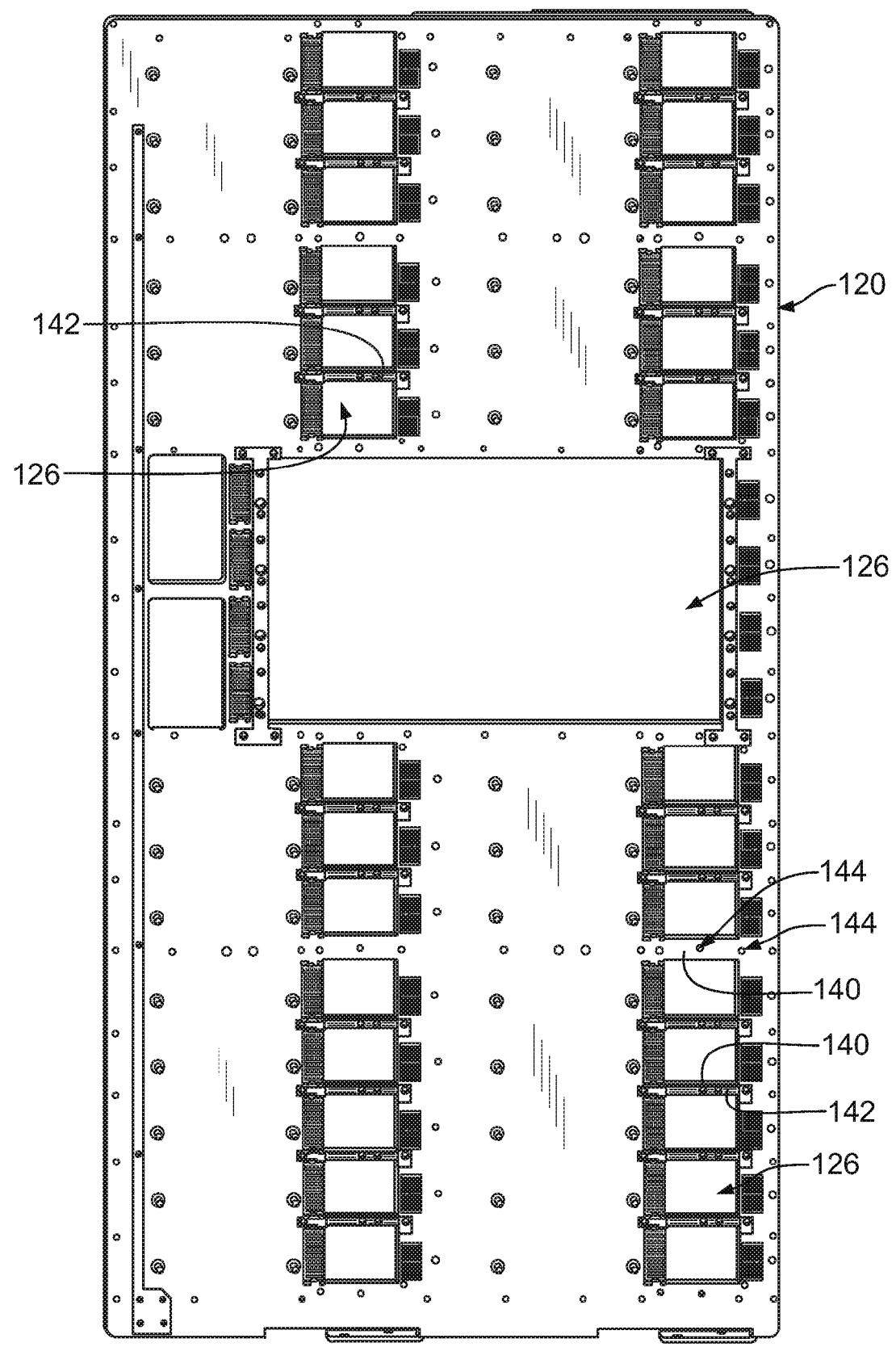
FIG. 3 illustrates a backplane of the cable backplane system and formed in accordance with an exemplary embodiment.

FIG. 3 illustrates the backplane 120 formed in accordance with an exemplary embodiment. The backplane 120 includes the openings 126 that receive the cable connectors 116 and/or portions of the trays 114 (both shown in FIG. 1). The openings 126 may be single openings that receive single cable connectors 116, such as the cable connectors 116 associated with the line cards 102 (shown in FIG. 1). The openings 126 may be large openings that receive multiple cable connectors 116, such as the cable connectors associated with the switch cards 104 (shown in FIG. 1).

The backplane 120 includes crossbars 140 between adjacent openings 126. The crossbars 140 provide support for the backplane 120. The crossbars 140 provide a mounting location for mounting blocks 142 (examples of which are shown mounted to the backplane 120 for reference) used to secure the cable connectors 116 to the backplane 120. Optionally, mounting blocks 142 may be provided at each crossbar 140. Mounting blocks 142 may be provided adjacent each opening 126. The crossbars 140 may define stiffeners for the mounting blocks 142 during assembly of the cable backplane system 100 (shown in FIG. 1). The mounting blocks 142 may be metal stiffeners separately fabricated from the backplane 120 and attached to the backplane 120. Alternatively, the mounting blocks 142 may be part of the backplane 120. For example, the mounting blocks 142 may be defined by an opening through the backplane 120 and the area of the backplane 120 around such opening. The opening may be threaded. The backplane 120 may be thicker in the area of the mounting block 142 to add rigidity to the backplane 120 in such area.

The backplane 120 includes holes 144 therethrough that receive guide features, fasteners or other components used to assembly the cable backplane system 100. The backplane 120 may include component openings 146 therethrough that receive other electrical components that are attached to the backplane 120. Some electrical components may be surface mounted to the backplane 120.

Figure 4:
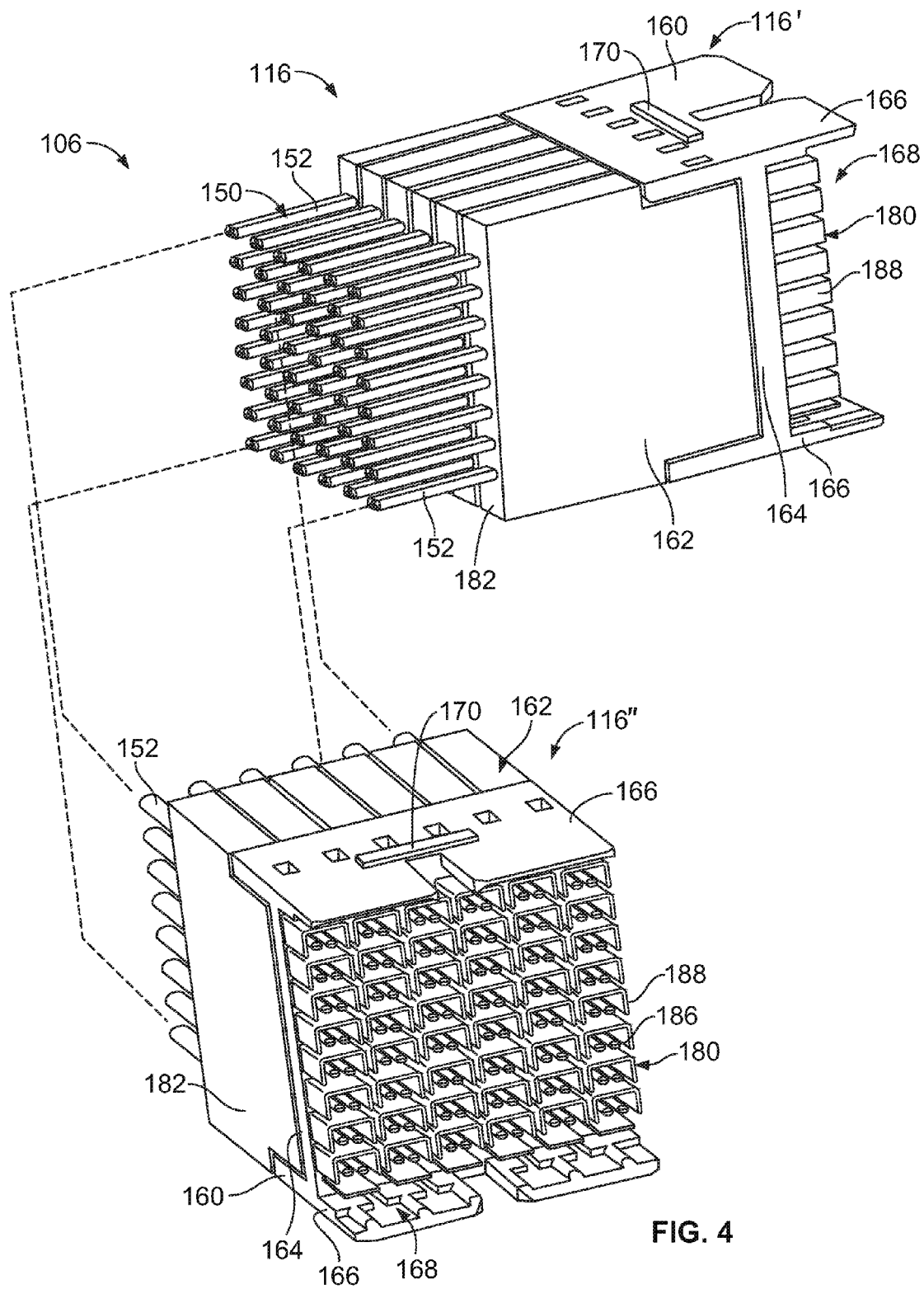
FIG. 4 illustrates a cable connector assembly of the cable backplane system and formed in accordance with an exemplary embodiment.

FIG. 4 illustrates a cable connector assembly 106 formed in accordance with an exemplary embodiment. The cable connector assembly 106 includes a plurality of the cable connectors 116, which may be referred to hereinafter as first and second cable connectors 116', 116", and a cable bundle 150 between the cable connectors 116. The cable connectors 116 are provided at ends of the cable bundle 150. The cable bundle 150 includes a plurality of cables 152. Optionally, the first cable connector 116' may be connected to a card connector 132 (shown in FIG. 1) of a line card 102 (shown in FIG. 1) and the second cable connector 116" may be connected to a card connector 134 (shown in FIG. 1) of the switch card 104 (shown in FIG. 1).

Optionally, the cable connectors 116 may be identical to one another. The cable connectors 116 may define header connectors. The cable connectors 116 are configured to be mated with corresponding card connectors 132, 134, which may be receptacle connectors, such as STRADA Whisper receptacle connectors, commercially available from TE Connectivity, Harrisburg, Pa. In an exemplary embodiment, the cable connector 116 is a high speed differential pair cable connector that includes a plurality of differential pairs of conductors mated at a common mating interface. The differential conductors are shielded along the signal paths thereof to reduce noise, crosstalk and other interference along the signal paths of the differential pairs.

In an exemplary embodiment, the cables 152 are twin axial cables having two signal wires within a common jacket of the cable 152. The signal wires convey differential signals. In an exemplary embodiment, the signal wires are shielded, such as with a cable braid of the cable 152. Optionally, each of the signal wires may be individually shielded. Other types of cables 152 may be provided in alternative embodiments. For example, coaxial cables may extend from the cable connector 116 each carrying a single signal conductor therein.

The cable connector 116 includes a header housing 160 holding a plurality of contact modules 162. The header housing 160 includes a base wall 164 and shroud walls 166 extending from the base wall 164 to define a mating cavity 168 configured to receive the corresponding card connector 132, 134. The shroud walls 166 guide mating of the card connector 132, 134 with the cable connector 116. In an exemplary embodiment, the header housing 160 has lugs 170 extending outward from the walls 166. The lugs 170 are used to locate the cable connector 116 with respect to the corresponding tray 114 (shown in FIG. 2).

Each of the contact modules 162 includes a plurality of cable assemblies 180 held by a support body 182. Each cable assembly 180 includes a pair of signal contacts 186 terminated to corresponding signals wires of the cable 152. Each cable assembly 180 also includes a ground shield 188 providing shielding for the signal contacts 186. In an exemplary embodiment, the ground shield 188 peripherally surrounds the signal contacts 186 along the entire length of the signal contacts 186 to ensure that the signal paths are electrically shielded from interference.

The support body 182 provides support for the cable assemblies 180. The cables 152 extend into the support body 182 such that the support body 182 supports a portion of the cables 152. The support body 182 may provide strain relief for the cables 152. Optionally, the support body 182 may be manufactured from a plastic material. Alternatively, the support body 182 may be manufactured from a metal material. The support body 182 may be a metalized plastic material to provide additional shielding for the cables 152 and the cable assemblies 180. Optionally, the support body 182 may include a metal plate electrically connected to each ground shield 188 to electrically common each ground shield 188 and a dielectric overmold overmolded around the cables 106 and portions of the metal plate to support the cables 152 and cable assemblies 180.

Multiple contact modules 162 are loaded into the header housing 160. The header housing 160 holds the contact modules 162 in parallel such that the cable assemblies 180 are aligned in a column. Any number of contact modules 162 may be held by the header housing 160 depending on the particular application. When the contact modules 162 are stacked in the header housing 160, the cable assemblies 180 may also be aligned in rows.

Figure 5:
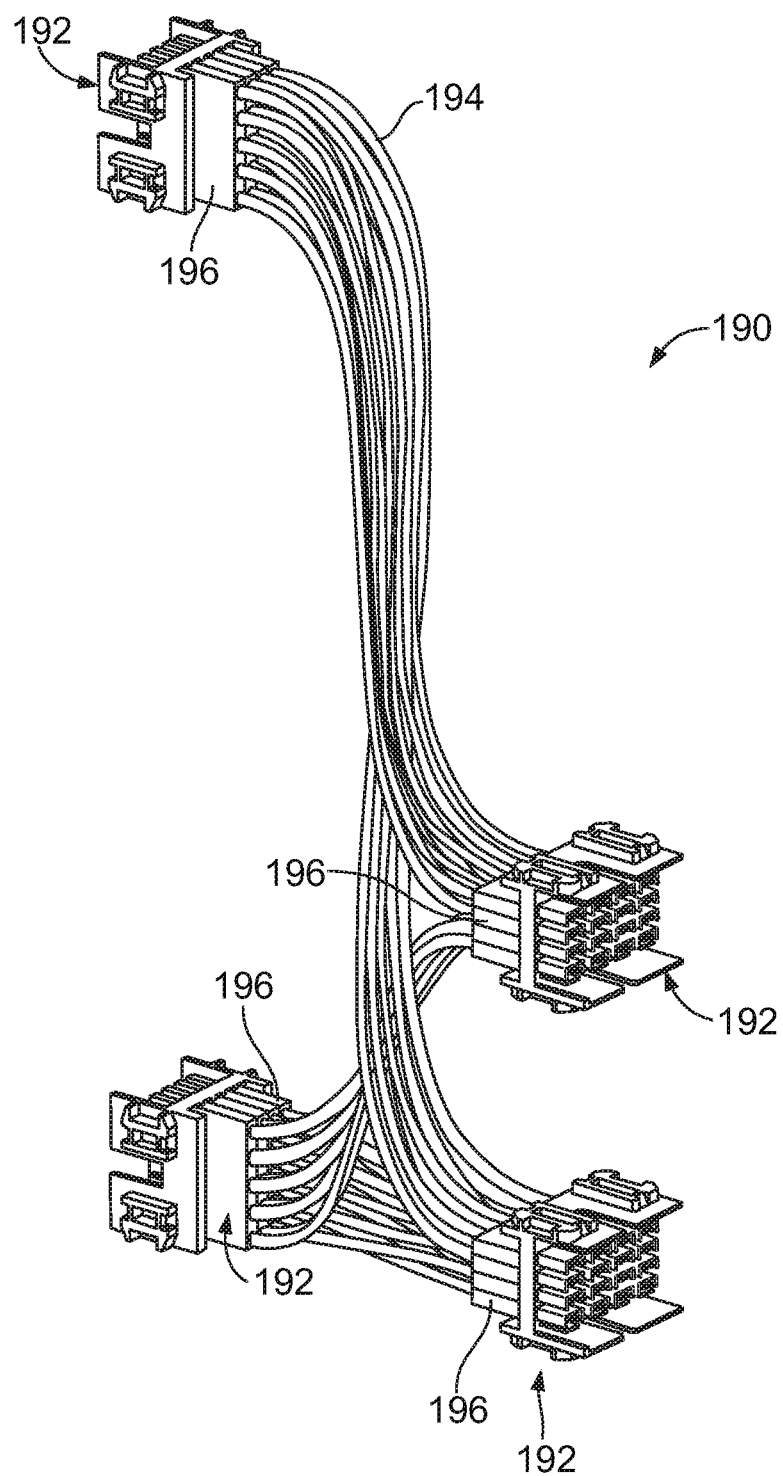
FIG. 5 illustrates a cable connector assembly formed in accordance with an exemplary embodiment.

FIG. 5 illustrates a cable connector assembly 190 formed in accordance with an exemplary embodiment. The cable connector assembly 190 is similar to the cable connector assembly 106 (shown in FIG. 4); however the cable connector assembly 190 includes more cable connectors 192 (e.g. four cable connectors 192 are shown in the embodiment illustrated in FIG. 5). Some of the cable connectors 192 may be used to interconnect with receptacle or card connectors 134 associated with the switch card 104 (both shown in FIG. 1), such as the bottom two cable connectors 192, while other cable connectors 192 may be used to interconnect with receptacle or card connectors 132 associated with the line card 102 (both shown in FIG. 1). Optionally, cables 194 from the same cable connector 192, such as cables from different contact modules 196, may be routed to several other cable connectors 192.

Figure 6:
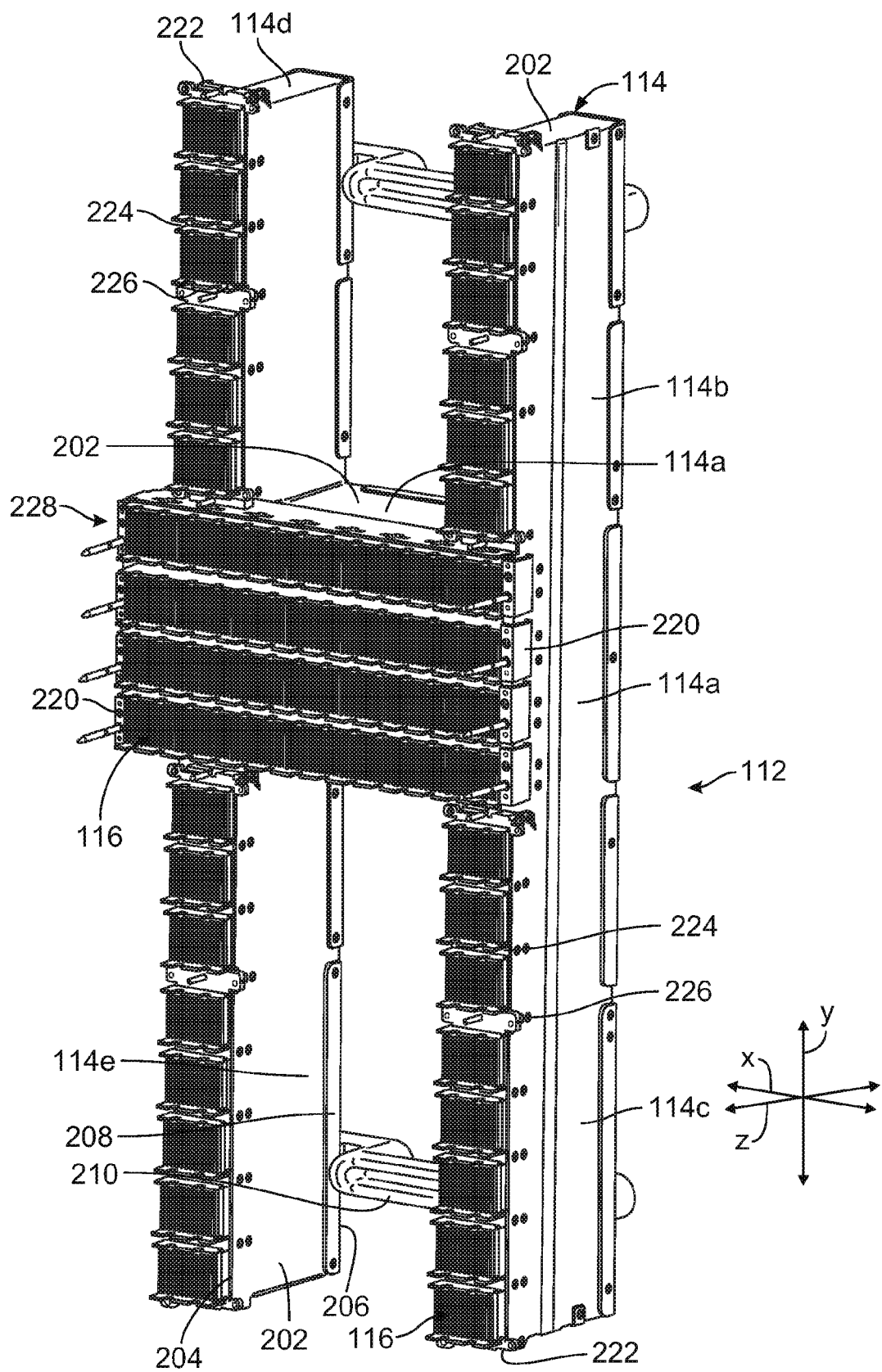
FIG. 6 illustrates a cable rack of the cable backplane system and formed in accordance with an exemplary embodiment.

FIG. 6 illustrates the cable rack 112. The cable rack 112 includes one or more trays 114 connected together to form the cable rack 112. In the illustrated embodiment, the cable rack 112 includes five trays 114a, 114b, 114c, 114d and 114e; however any number of trays 114 may be used in alternative embodiments. The trays 114 are coupled together into an H-shaped configuration having the first tray 114a at a central location with the other trays 114b, 114c, 114d, 114e extending outward from the first tray 114a as legs. The cable rack 112 may have other shapes in alternative embodiments.

In an exemplary embodiment, the first tray 114a is used to hold the cable connectors 116 that are mated with the card connectors 134 of the switch cards 104 (both shown in FIG. 1). The cable connectors 116 in the first tray 114a may be held together as a brick 228. The cable connectors 116 of each brick 228 are connected to the card connectors 134 of the same switch card 104. The other trays 114b, 114c, 114d, 114e are used to hold the cable connectors 116 that are mated with the card connectors 132 of the line cards 102 (both shown in FIG. 1). Optionally, the cable connectors 116 aligned at the same vertical position but in different trays (e.g. 114b and 114d or 114c and 114e) are connected to the card connectors 132 of the same line card 102.

Each tray 114 includes a frame 200 surrounding a raceway through which the cables 152 (shown in FIG. 4) are routed. The raceways are open to one another to allow the cables 152 to be routed from one tray 114 into another tray 114. The frame 200 includes side walls 202 extending between a front edge 204 and a rear 206 of the tray 114. A back wall 208 covers the raceway at the rear 206. The frame 200 is open at the front edge 204 between the side walls 202 to receive the cable connectors 116 therein.

In an exemplary embodiment, the side walls 202 and back wall 208 are sheet metal pieces that are stamped, formed and coupled together, such as using fasteners or other connecting means. The sheet metal may be thin enough to allow the frame 200 to have some flexibility for moving, twisting or otherwise manipulating the trays 114 into position relative to the backplane 120 (shown in FIG. 3) to position the cable connectors 116 in the openings 126 (shown in FIG. 3) in the backplane 120. Optionally, the trays 114 may be connected to each other with some freedom of movement or float built in to the connection to allow the trays 114 to move relative to one another to properly align the cable connectors 116 with the openings 126 in the backplane 120.

In an exemplary embodiment, the cable rack 112 includes handles 210 used to hold the trays 114 together. The handles 210 may be used to pick up the cable rack 112 and load the cable rack 112 onto the backplane 120 during assembly. Because of the size of the cable rack 112, assembly and loading of the cable connectors 116 and/or front edge 204 of the frame 200 into the openings 126 may be difficult. The handles 210 make moving of the cable rack 112 easier. The handles 210 may be removable once the cable rack 112 is coupled to the backplane 120.

The cable rack 112 includes a plurality of spacers 220, 222, 224, 226 used to hold positions of the cable connectors 116. The spacers 220, 222, 224, 226 may be different types of spacers. The spacers 220, 222, 224, 226 may have different sizes, shapes and/or features, such as guide pins. The spacers 220, 222, 224, 226 generally have similar functions, such as supporting one or more cable connectors 116.

In the illustrated embodiment, the spacers 220 are provided along sides of corresponding bricks 228 of cable connectors 116 that are located in the tray 114a. The bricks 228 are a group of cable connectors 116 that are held together in a stacked arrangement for mating with a plurality of the card connectors 134 of the same switch card 104 (both shown in FIG. 1). The spacers 220 may be referred to hereinafter as side spacers 220 or brick spacers 220. The spacers 222 are provided at ends of the trays 114b, 114c, 114d, 114e, such as to support the end-most cable connectors 116 in such trays 114. The spacers 222 may be referred to hereinafter as end spacers 222. The end spacers 222 are provided at the top and bottom ends of the cable rack 112. The end spacers 222 support a single cable connector 116. The spacers 224 are provided between adjacent cable connectors 116. The spacers 224 may be referred to hereinafter as intermediate spacers 224. The spacers 224 each support two cable connectors 116. The spacers 226 are provided between adjacent cable connectors 116, similar to the intermediate spacers 224; however the spacers 226 have guide pins extending therefrom, which may be used for guiding the cable rack 112 into alignment and engagement with the backplane 120. The spacers 226 may be referred to hereinafter as guide spacers 226.

In an exemplary embodiment, the cable connectors 116 are movable relative to the spacers 220, 222, 224, 226 to allow the cable connectors 116 to align with the corresponding openings 126 during assembly of the cable rack 112 and backplane 120. For example, the spacers 220, 222, 224, 226 may allow X, Y and/or Z float to allow fine alignment of the cable connectors 116 with the openings 126. Once the cable connectors 116 are positioned in the openings 126, the spacers 220, 222, 224, 226 may be fixed to the mounting blocks 142 (shown in FIG. 3), such as using fasteners to securely couple the cable rack 112 to the backplane 120 with the cable connectors 116 generally in position for mating with the corresponding card connectors 132, 134. In an exemplary embodiment, the cable connectors 116 are configured to float within the openings 126 relative to the spacers 220, 222, 224, 226 to obtain a true position for aligning to and mating with the corresponding card connectors 132, 134.

Figure 7:
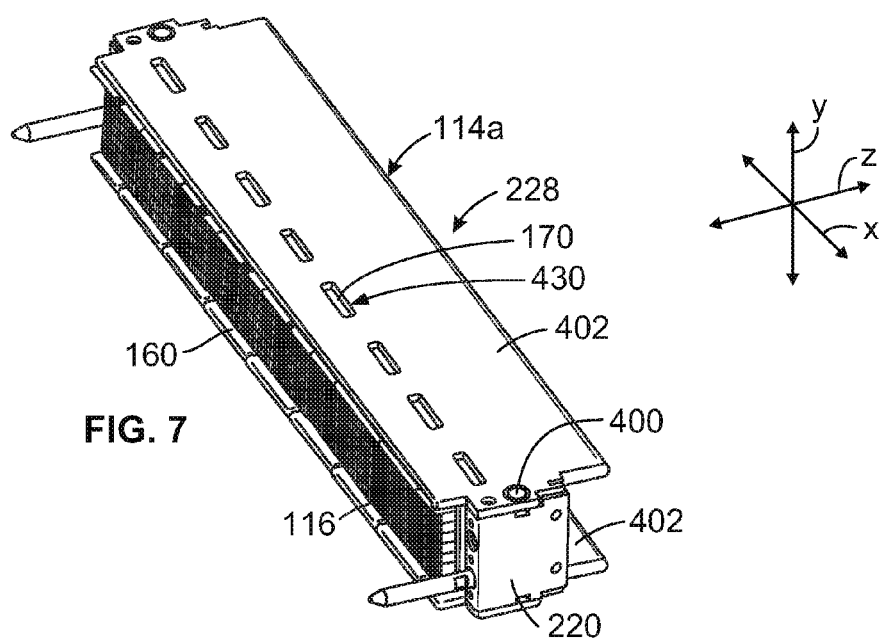
FIG. 7 is a front view of a portion of the cable backplane system.

FIG. 7 illustrates one of the bricks 228 forming part of the first tray 114a (shown in FIG. 6). The brick 228 includes plates 402, which may be top and bottom plates extending along tops and bottoms of the cable connectors 116. The plates hold the cable connectors 116 of the brick 228. The plates 402 may form parts of the side walls 202 (shown in FIG. 6) of the tray 114a.

The side spacers 220 are positioned between the plates 402. The side spacers 220 are configured to be coupled to corresponding mounting blocks 142 (shown in FIG. 3) on the backplane 120 (shown in FIG. 3). The mounting blocks 142 secure the side spacers 220 in place relative to the backplane 120. The side spacers 220 are coupled to the plates 402 using float mechanisms 400 which allow movement in mutually perpendicular X, Y and/or Z directions. The plates 402 and the cable connectors 116 are thus movable relative to the side spacers 220 to properly position the cable connectors 116 relative to the backplane 120.

Figure 8:
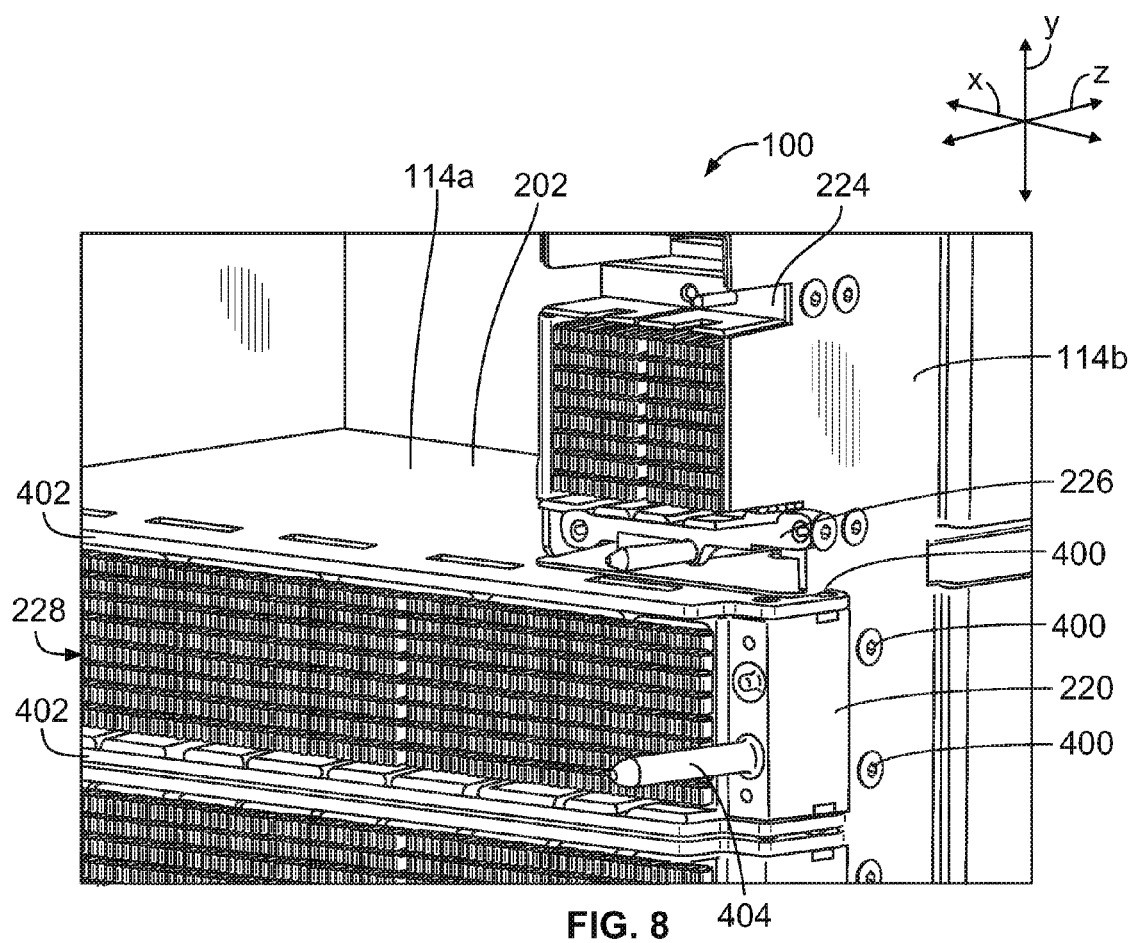
FIG. 8 is a front view of a portion of the cable backplane system.

FIG. 8 is a front view of a portion of the cable backplane system 100. FIG. 8 illustrates the trays 114a, 114b showing the spacers 220, 224, 226 used for mounting the trays 114 to the backplane 120 (shown in FIG. 1). In an exemplary embodiment, the first tray 114a is secured to the second tray 114b using float mechanisms 400. The float mechanisms 400 are coupled to the side spacers 220. The side walls 202 of the first tray 114a are movable relative to the side spacer 220 using corresponding float mechanisms 400. The second tray 114b is movable relative to the side spacer 220 using corresponding float mechanisms 400. The float mechanisms 400 thus allow relative movement between the first and second trays 114a, 114b. The float mechanisms 400 allow movement in mutually perpendicular X, Y and Z directions. The other trays 114 may be connected together in a similar manner using similar types of float mechanisms 400.

In an exemplary embodiment, the float mechanisms 400 are fasteners such as a countersink screws. The float mechanisms 400 may be fasteners that are received in oversized holes or apertures in the trays 114 that allow the float mechanisms 400 to move in one or more directions relative to the trays 114. A circumferential gap may be defined around the float mechanism 400 in the aperture in the side wall 202 allowing the float mechanism 400 to move within the aperture. The size of the gap defines the amount of float. Optionally, the gap may allow approximately 1.0 mm of float in the X, Y and Z directions; however the gap may allow more or less float in alternative embodiments. Other types of float mechanisms may be used in alternative embodiments that tie the trays 114 together but allow limited relative movement therebetween.

Figure 9:
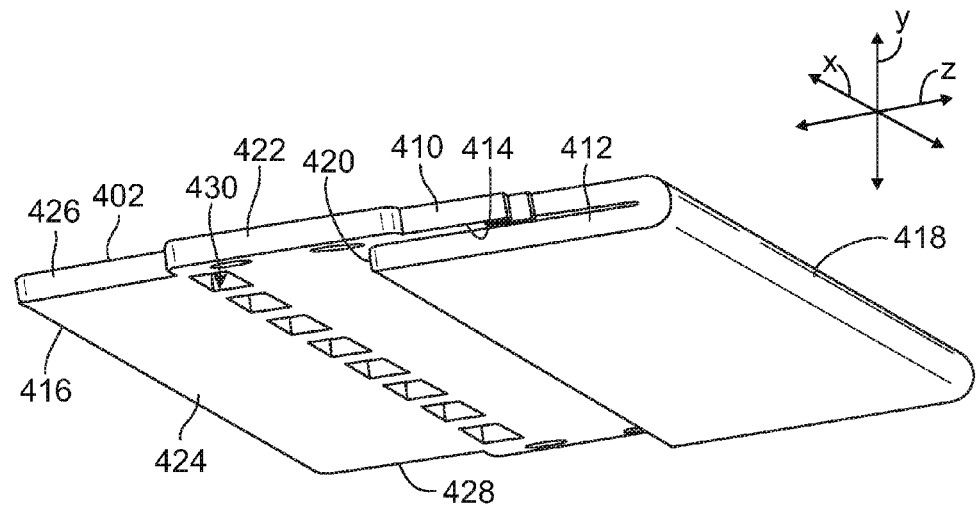
FIG. 9 is a perspective view of a plate of the cable backplane system.

FIG. 9 is a perspective view of one of the plates 402. The plate 402 includes a main panel 410 and a hem 412 folded along an interior surface 414 of the main panel 410. The plate 402 is folded over to form the hem 412. The main panel 410 includes a front 416 and a rear 418 opposite the front 416. The hem 412 is provided at the rear 418. Optionally, the hem 412 may be fixed to the main panel 410, such as by welding the hem 412 to the main panel 410. The hem 412 doubles the thickness of the plate 402 at the rear 418 to stiffen the plate 402. The hem 412 reduces twisting or bending of the plate 402, such as in the Y direction. In an exemplary embodiment, when the plate 402 is folded over to form the hem 412, the plate 402 has a curved edge at the rear 418. The curved edge reduces the risk of cutting or slicing the cables 152 (shown in FIG. 4) that are routed into and out of the brick 228 (shown in FIG. 8). In an exemplary embodiment, the hem 412 has a forward facing edge 420. As described in further detail below, the forward facing edge 420 is used to support the cable connectors 116 (shown in FIG. 8) relative to the plate 402.

The plate 402 has opposite first and second ends 422, 424 and opposite first and second sides 426, 428. The ends 422, 424 may define top and bottom ends. The sides 426, 428 are configured to engage the side spacers 220 (shown in FIG. 8). The plate 402 includes a plurality of slots 430 extending therethrough. The slots 430 may extend only partially therethrough, defining pockets.

Returning to FIG. 7, the slots 430 are configured to receive the lugs 170 to support the housings 160 of the cable connectors 116. In an exemplary embodiment, the slots 430 are oversized relative to the lugs 170 to allow the cable connectors 116 to float relative to the plate 402. The size of the slots 430 relative to the lugs 170 defines the amount of float. The slots 430 may be oversized in at least two mutually perpendicular directions, such as the X and Z directions, to allow float in at least two mutually perpendicular directions. Allowing the cable connectors 116 to float allows the cable connectors 116 to align with the card connectors 134 even after the tray 114 is secured to the backplane 120. The cable connectors 116 can float within the opening 126 in the backplane 120 to allow for proper mating with the card connectors 134.

Figure 10:
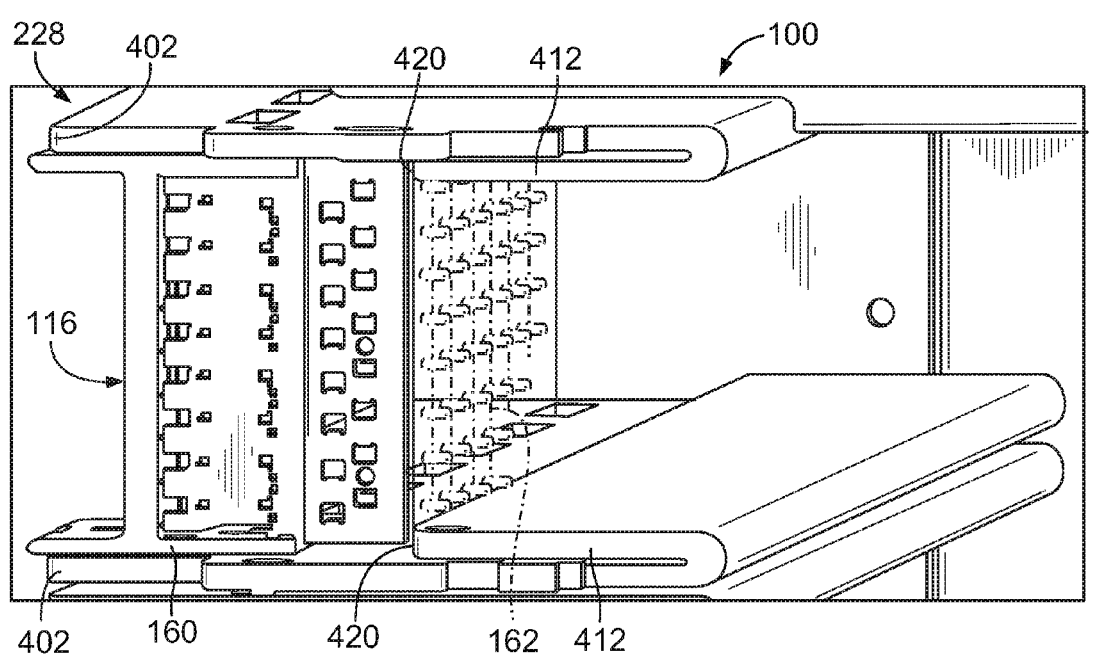
FIG. 10 illustrates a portion of the cable backplane system showing cable connectors mounted between plates.

FIG. 10 illustrates a portion of the cable backplane system 100 showing the cable connectors 116 mounted between the plates 402 of a brick 228. The hems 412 of both plates 402 are folded inward into the interior of the brick 228. The forward facing edges 420 of the hems 412 are generally aligned with one another and are positioned rearward of the cable connectors 116. The hems 412 are positioned directly behind the contact modules 162 of the cable connectors 116. The hems 412 block rearward movement of the contact modules 162 and thus prevent removal of the contact modules 162 from the housing 160. For example, when the cables 152 (shown in FIG. 4) are manipulated or pulled, the hems 412 will prevent the contact modules 162 from being pulled out of the housing 160. The hems 412 provide a backup retention feature in a Z direction.

Figure 11:
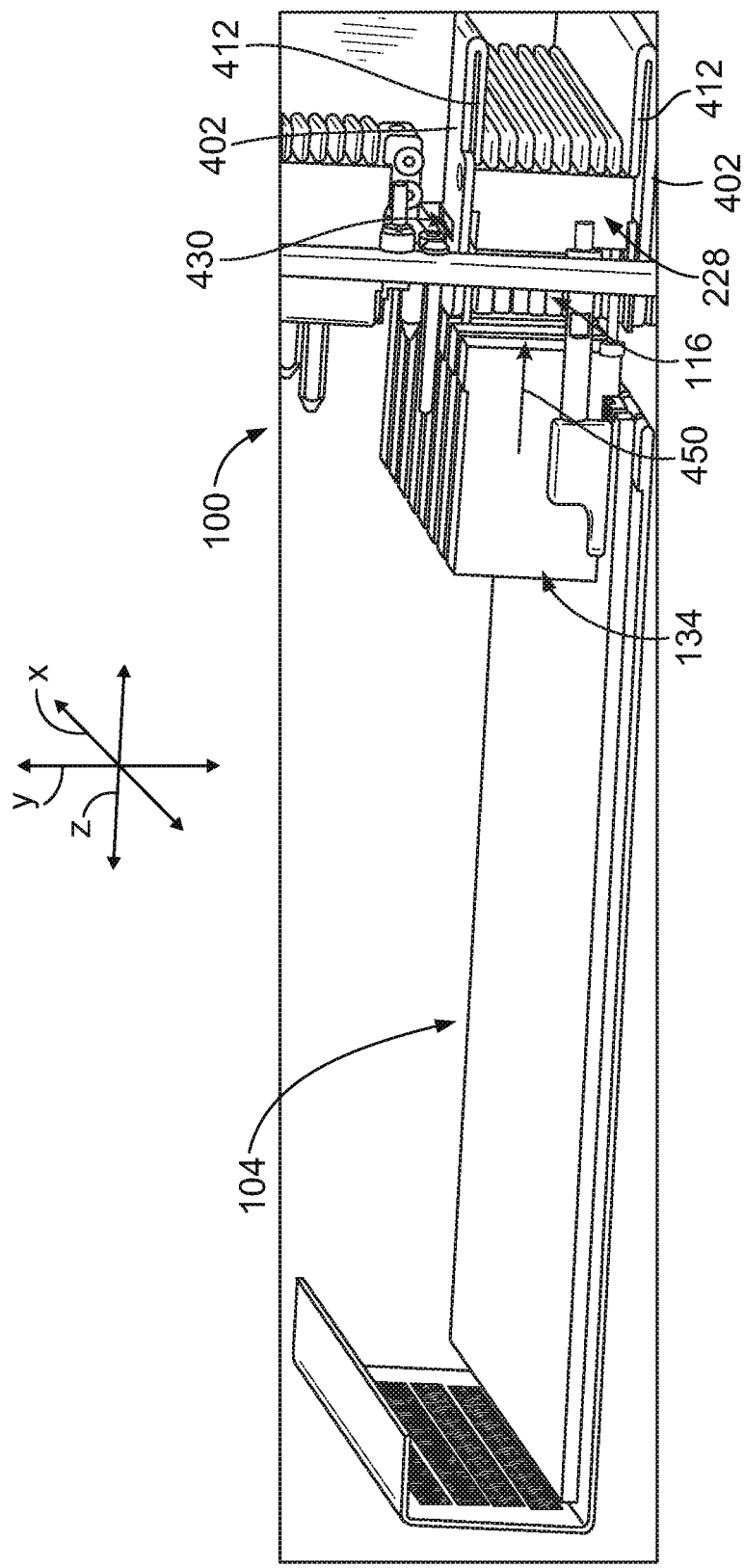
FIG. 11 illustrates a portion of the cable backplane system showing a switch card and corresponding card connectors being mated to the cable backplane system.

FIG. 11 illustrates a portion of the cable backplane system 100 showing the switch card 104 and corresponding card connectors 134 being mated to the brick 228. When the switch card 104 is plugged into the cable backplane system 100, a plugging force 450 acts on the cable connectors 116 in the Z direction. The plugging force 450 tends to push the cable connectors 116 rearward. The hems 412 block the cable connectors 116 from being pushed rearward and operate as a backup retention feature. When the switch card 104 is plugged into the cable backplane system 100, the plugging force 450 tends to force the plates 402 outward in the Y direction. The hems 412 provide stiffening of the plates 402 to resist outward deflection of the plates 402. If the plates 402 were allowed to deflect outward, the lugs 170 (shown in FIG. 7) might dislodge from the slots 430, allowing the cable connectors 116 to be forced out of the brick 228.

Figure 12:
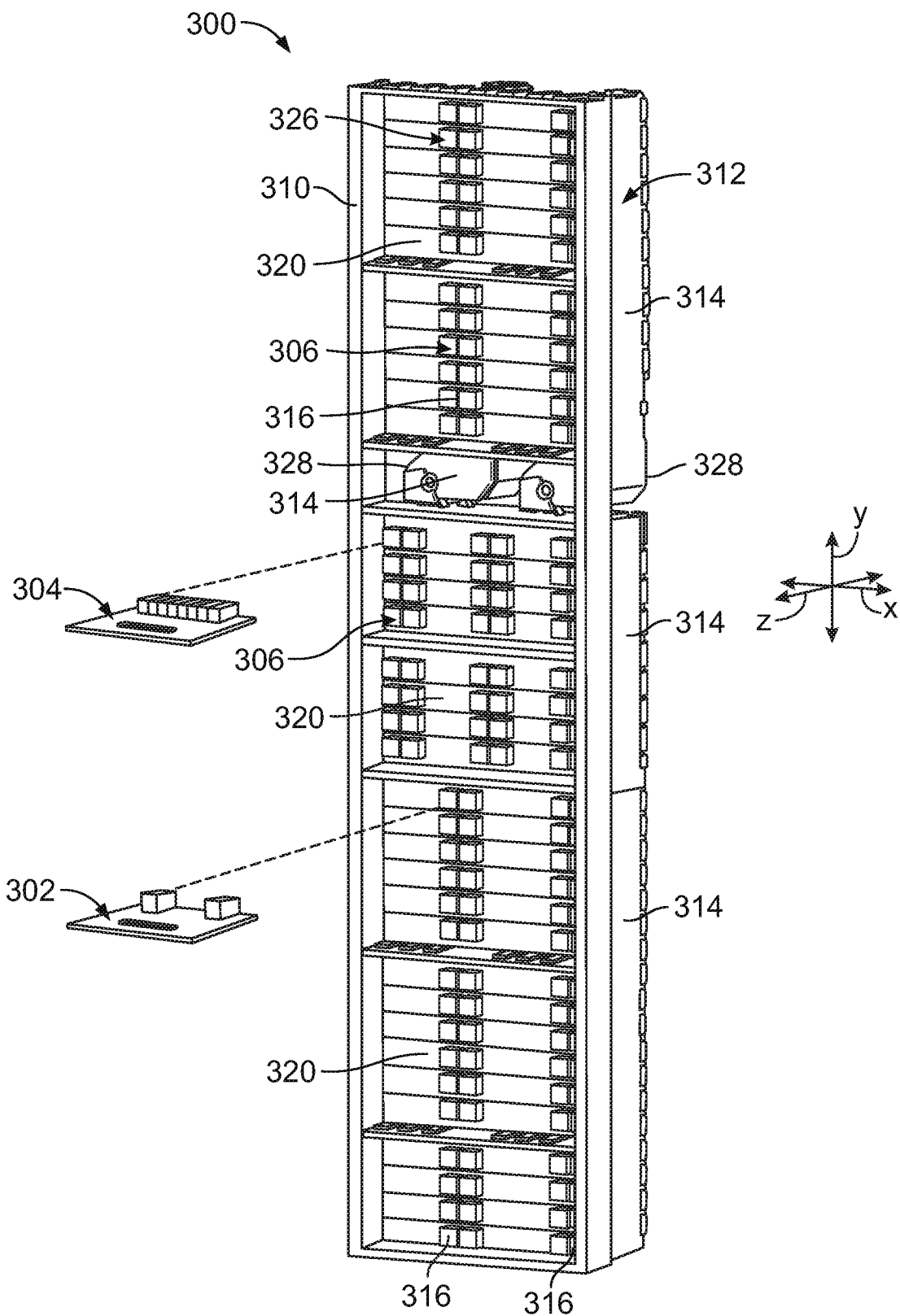
FIG. 12 is a front view of a cable backplane system formed in accordance with an exemplary embodiment.
Figure 13:
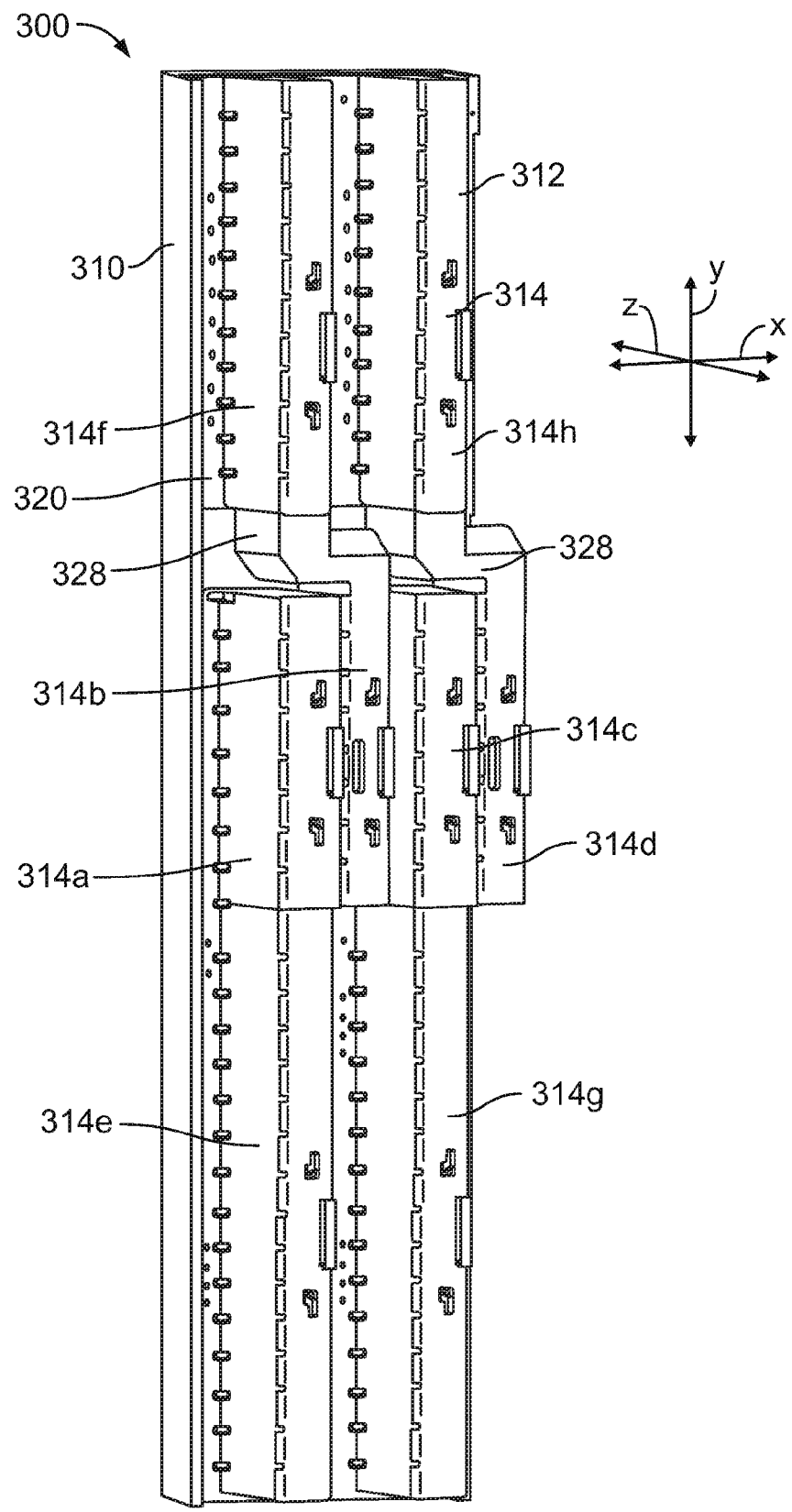
FIG. 13 is a rear perspective view of the cable backplane system.

FIG. 12 is a front view of a cable backplane system 300 formed in accordance with an exemplary embodiment. FIG. 13 is a rear perspective view of the cable backplane system 300. The cable backplane system 300 is similar to the cable backplane system 100 (shown in FIGS. 1 and 2) and includes similar components in a different arrangement than the arrangement of the cable backplane system 100. The cable backplane system 300 interconnects line cards 302 and switch cards 304 using cable connector assemblies 306.

The cable backplane system 300 includes a chassis 310 that supports the components of the cable backplane system 300. The chassis 310 may include a rack, a cabinet or other suitable structures for holding the components of the cable backplane system 300. The cable backplane system 300 includes a cable rack 312 that supports and/or manages the cables of the cable backplane system 300. The cable rack 312 includes a plurality of trays 314 that are held together and extend along different portions of the cable backplane system 300. The trays 314 are arranged in a different arrangement than the arrangement of the trays 114 (shown in FIG. 2). The cable rack 312 supports a plurality of cable connectors 316, which form parts of the cable connector assemblies 306. At least some of the cable connectors 316 may be arranged in bricks 318, similar to the bricks 228 (shown in FIG. 7). The bricks 318 may include similar components as the bricks 228, such as plates having hems used to retain the cable connectors 316 and slots that allow the cable connectors 316 to float relative to the plates.

The cable backplane system 300 includes a plurality of backplanes 320. The backplanes 320 are separately manufactured from one another and separately mounted to and supported by the chassis 310. In the illustrated embodiment, three backplanes 320 are separately mounted to the chassis 310. The trays 314 interconnect with multiple backplanes 320. In order for the trays 314 to connect to different backplanes 320, the trays 314 are movable relative to each other and/or the backplanes 320. The trays 314 are flexible and have mounting features that allow the trays 314 to float relative to each other. In an exemplary embodiment, the mounting features are float mechanisms directly coupled between two trays 314 that allow the trays 314 to float and move relative to one another in X, Y and Z directions.

In an exemplary embodiment, the cable rack 312 is flexible to allow the cable connectors 316 to align with and pass through openings 326 in the backplanes 320. The trays 314 may float relative to each other to properly align the cable connectors 316 with the corresponding openings 326. The backplane 320 holds the cable connectors 316 in precise locations for mating with the line and switch cards 302, 304.

In the illustrated embodiment, the cable rack 312 includes eight trays 314a, 314b, 314c, 314d, 314e, 314f, 314g and 314h; however any number of trays 314 may be used in alternative embodiments. The trays 314 are coupled together into an H-shaped configuration having four of the trays 314a, 314b, 314c, 314d at a central location with the other trays 314e, 314f, 314g, 314h extending above or below corresponding trays 314a, 314b, 314c, 314d as legs. The bottom trays 314e, 314g are arranged in line with the corresponding center trays 314a, 314c. The top trays 314f, 314h are offset from the corresponding center trays 314b, 314d. The center trays 314b, 314d have transition sections 328 that transition to the top trays 314f, 314h. The top trays 314f, 314h are generally vertically aligned with the bottom trays 314e, 314g. The cable rack 312 may have other shapes in alternative embodiments.

In an exemplary embodiment, the center trays 314a, 314b, 314c, 314d are used to hold the cable connectors 316 that are mated with the card connectors of the switch cards 304 (shown in FIG. 12). The top and bottom trays 314e, 314f, 314g, 314h are used to hold the cable connectors 316 that are mated with the card connectors of the line cards 302 (shown in FIG. 12).

Figure 14:
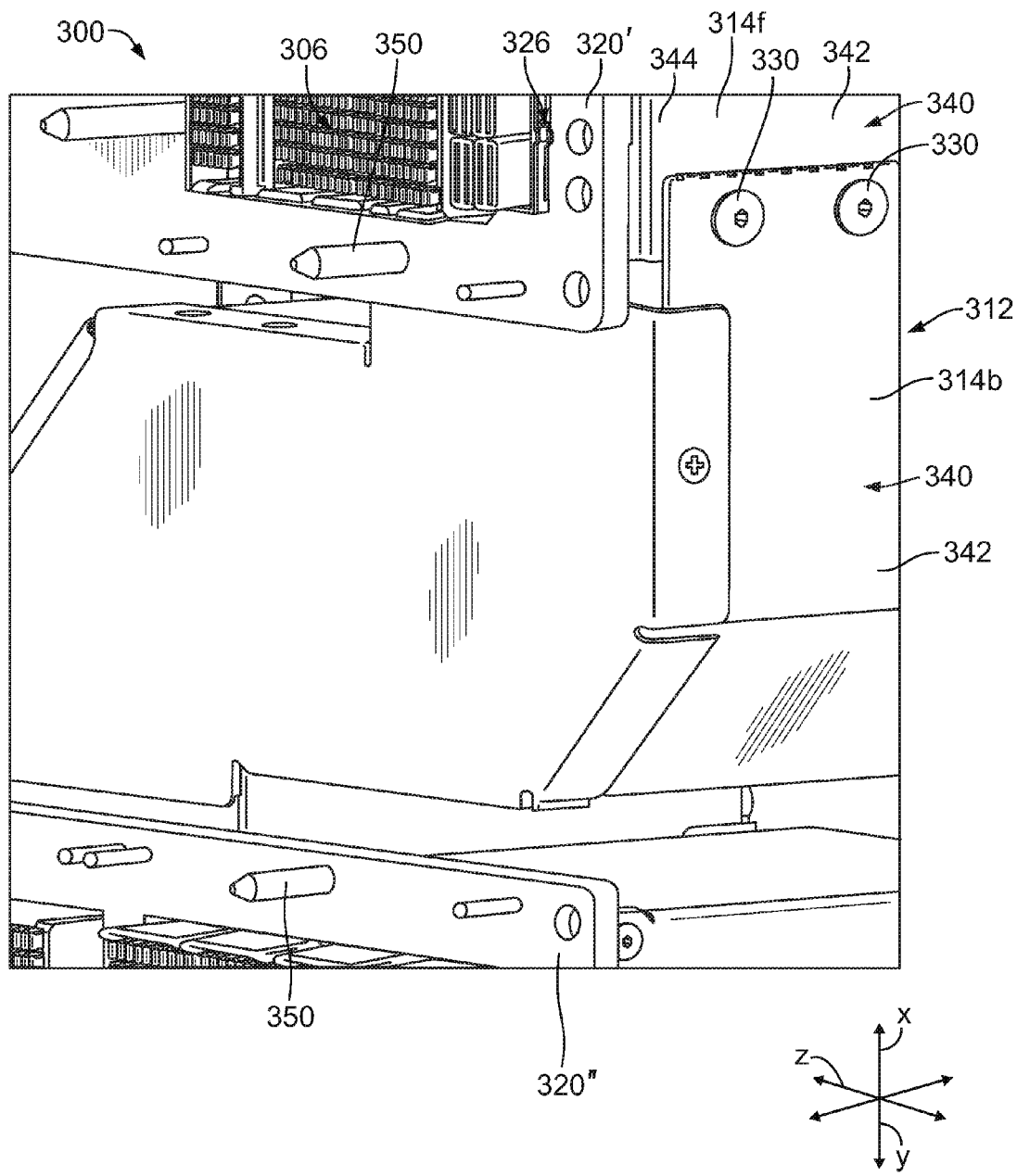
FIG. 14 is a front view of a portion of the cable backplane system.

FIG. 14 is a front view of a portion of the cable backplane system 300. FIG. 14 illustrates two backplanes 320', 320" mounted to the chassis 310 (shown in FIG. 12). FIG. 14 illustrate the trays 314b, 314f mounted to the backplanes 320 and secured to each other using float mechanisms 330. The float mechanisms 330 allow the trays 314b, 314f to float and move relative to one another in X, Y and Z directions. The cable connector assemblies 306 within the respective trays 314b, 314f may be aligned with the openings 326 and the float mechanisms 330 allow the trays 314b, 314 to move relative to each other to align with the corresponding openings 326. For example, because the tray 314b is coupled to one backplane 320" while the tray 314f is coupled to the other backplane 320', the trays 314b, 314f need to be able to move relative to each other to allow proper alignment with the corresponding backplane 320. The float mechanisms 330 tie the trays 314 together but allow some float or movement in at least two directions. In an exemplary embodiment the float mechanisms 330 allow relative movement of the trays 314 in three dimensions (e.g. X, Y and Z float). The float mechanisms may be shoulder screws or other types of fasteners that secure the trays 314 together while allowing some limited movement between the trays 314. The trays 314 may have oversized openings that allow the float mechanisms to float within the openings.

The trays 314 each include a frame 340 surrounding a raceway through which cables of the cable connector assemblies 306 (shown in FIG. 12) are routed. The raceways of the trays 314b, 314f are open to one another to allow the cables to be routed from one tray 314b into the other tray 314f. The frame 340 includes side walls 342, which may be sheet metal pieces that are stamped, formed and coupled together, such as using fasteners or other connecting means. The sheet metal may be thin enough to allow the frame 340 to have some flexibility for moving, twisting or otherwise manipulating the trays 314 into position relative to the backplanes 320 to position the cable connectors 316 in the corresponding openings 326. Optionally, the trays 314 may be connected to each other with some freedom of movement or float built in to the connection to allow the trays 314 to move relative to one another to properly align the cable connectors 316 with the openings 326 in the backplanes 320.

In an exemplary embodiment, the cable backplane system 300 includes spacers (not shown), similar to the spacers 220, 222, 224 and/or 226 (shown in FIG. 6), between and supporting corresponding cable connectors 316. At least some of the spacers may include guide pins 350 extending forward therefrom. The guide pins 350 are loaded into corresponding holes 351 in the backplanes 320 to position the cable rack 312 relative to the backplanes 320. The guide pins 350 may fix the X and Y position of the spacer relative to the corresponding backplane 320, however the cable connectors may still be movable, such as to align with the openings 326 and/or the card connectors of the line cards 302 and switch cards 304. The spacers may be secured to the trays 314 using float mechanisms that allow the spacers to float with a limited range of motion relative to the trays 314. The spacers may thus be aligned with mounting blocks on the backplane 320 to position the cable connectors with respect to the openings 326. The float mechanisms may be fasteners that are received in oversized holes in the trays 314 that allow the float mechanisms to move in one or more directions relative to the trays 314.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A cable backplane system comprising:
a backplane having a plurality of openings therethrough;
a cable rack coupled to a rear of the backplane, the cable rack comprising:
a tray having a frame surrounding a raceway;
a brick held by the tray, the brick having side spacers at opposite sides of the brick, the brick having plates coupled to the side spacers, the plates supporting a plurality of cable connector assemblies, each cable connector assembly having a plurality of cables extending between at least two cable connectors, the cables being routed in the raceway, each cable connector assembly positioned between and supported by corresponding plates on opposite sides of the corresponding cable connectors with the cable connectors positioned in corresponding openings in the backplane;
wherein the plates each include a hem folded over at a rear of the plate, the hem increasing a thickness of the plate and providing rigidity to the plate along a length of the plate.

2. The cable backplane system of claim 1, wherein the hem extends along an interior surface of the plate at the rear of the plate.

3. The cable backplane system of claim 1, wherein the hem is fixed to the plate.

4. The cable backplane system of claim 1, wherein the hem doubles a thickness of the plate to stiffen the plate.

5. The cable backplane system of claim 1, wherein the plate is folded over at the rear of the plate to form the hem, the plate having a curved edge at the rear.

6. The cable backplane system of claim 1, wherein the hem has an edge positioned rearward of the cable connectors, the edge of the hem is forward facing, the edge blocking the cable connectors from moving in a rearward direction.

7. The cable backplane system of claim 1, wherein the cable connectors each comprise a housing and a plurality of contact modules received in the housing, the cables extending rearward from the contact modules, the hem having an edge positioned rearward of the cable connectors, the edge of the hem blocking removal of the contact modules from the housing.

8. The cable backplane system of claim 1, wherein the plates comprise slots therein, the cable connectors having lugs received in the slots to hold the cable connectors in the plates, the slots being oversized relative to the lugs to allow the cable connectors to float relative to the plates.

9. The cable backplane system of claim 8, wherein the cable connectors float in at least two mutually perpendicular directions relative to the plates.

10. The cable backplane system of claim 1, wherein the side spacers are coupled to the plates using float mechanisms, the float mechanism allowing limited movement of the plates relative to the side spacers.

11. A cable rack for a cable backplane system comprising:
a tray having a frame with side walls surrounding a raceway;
a brick held by the tray, the brick having side spacers at opposite sides of the brick, the brick having plates coupled to the side spacers, each plate having slots formed therein proximate to a front of the plate;
wherein the plates support a plurality of cable connector assemblies, each cable connector assembly having a plurality of cables extending between at least two cable connectors, the cables being routed in the raceway, each cable connector having lugs extending therefrom, the lugs of the cable connectors being received in corresponding slots in the plates, the slots being oversized relative to the lugs to allow the cable connectors to float relative to the plates.

12. The cable rack of claim 11, wherein the plates each include a hem folded over at a rear of the plate, the hem having an edge positioned rearward of the cable connectors and blocking the cable connectors from moving rearward relative to the plates.

13. The cable rack of claim 12, wherein the hem extends along an interior surface of the plate at a rear of the plate.

14. The cable rack of claim 12, wherein the hem is fixed to the plate.

15. The cable rack of claim 12, wherein the hem doubles a thickness of the plate to stiffen the plate.

16. The cable rack of claim 12, wherein the plate is folded over at a rear of the plate to form the hem, the plate having a curved edge at the rear.

17. The cable rack of claim 12, wherein the edge of the hem is forward facing, the edge blocking the cable connectors from moving in a rearward direction.

18. The cable rack of claim 12, wherein the cable connectors each comprise a housing and a plurality of contact modules received in the housing, the cables extending rearward from the contact modules, the edge of the hem blocking removal of the contact modules from the housing.

19. The cable rack of claim 11, wherein the cable connectors float in at least two mutually perpendicular directions relative to the plates.

20. The cable rack of claim 11, wherein the side spacers are coupled to the plates using float mechanisms, the float mechanism allowing limited movement of the plates relative to the side spacers.

* * * * *